United States Patent [19]

Arora

[11] 4,105,807
[45] Aug. 8, 1978

[54] PRODUCTION OF THIN, STABLE, SOLID ELECTROLYTE FILMS OF HIGH IONIC CONDUCTIVITY

[75] Inventor: Mulk Raj Arora, Kirkland, Canada

[73] Assignee: Unican Electrochemical Products Ltd., Montreal, Canada

[21] Appl. No.: 599,897

[22] Filed: Jul. 28, 1975

[51] Int. Cl.$^2$ ............... C23C 15/00; C23C 11/08
[52] U.S. Cl. ............... 427/126; 204/192 C; 427/248 R; 427/255; 429/191; 204/192 SP
[58] Field of Search ............ 204/192 C, 192 SP; 427/126, 255, 248 R; 136/62; 429/191

[56] References Cited

PUBLICATIONS

Takahashi et al., Solid–State Ionics–Solids with High Ionic Conductivity in Systems Silver Iodide–Silver Oxyacid Salts in J. Electrochem. Soc. 119(4): pp. 477–482, Apr. 1972.
Kennedy et al., Preparation of Vacuum–Deposited Films of Rubidium Silver Iodide, in J. Electrochem Soc., 120(3): pp. 454–458, Mar. 1973.

Primary Examiner—Michael F. Esposito
Attorney, Agent, or Firm—Max Gelden

[57] ABSTRACT

Production of thin stable films of oxy-anion-substituted silver iodide solid electrolytes, such as $Ag_{19}I_{15}P_2O_7$, on a substrate, such films having good ionic conductivity at room temperature, by vaporizing such oxy-anion-substituted silver iodide elecytrolyte material, or a mixture of the components thereof in stoichiometric proportions, by flash evaporation of such electrolyte material at high temperature, preferably ranging from about 1,400° to about 1,600° C, or by RF sputtering, preferably at electrode potentials ranging from about 700 to about 900 volts, and maintaining the substrate on which the solid electrolyte film is deposited, at certain elevated temperatures, preferably ranging from about 140° to about 150° C, to permit recombination and deposition of the vaporized constituents of the electrolyte material on the substrate, to form a thin film of the solid electrolyte such that the solid electrolyte film thus formed is neither iodine-rich nor iodine-poor, relative to the proper stoichiometry for such solid electrolyte.

22 Claims, 8 Drawing Figures

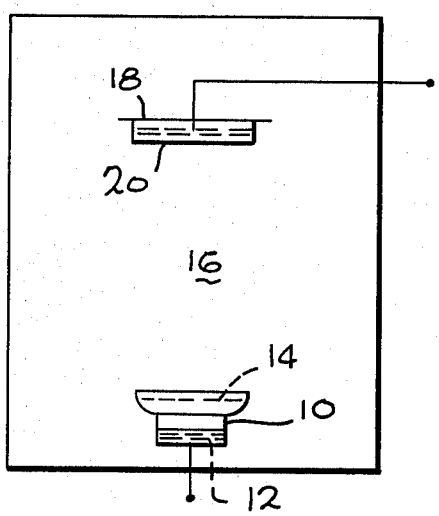
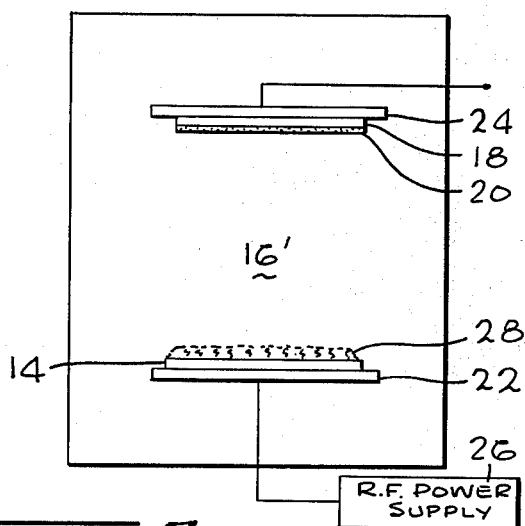
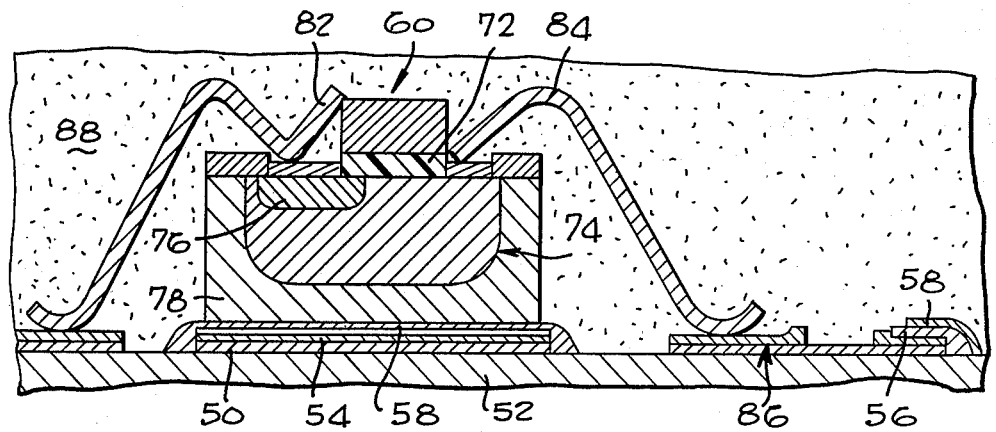
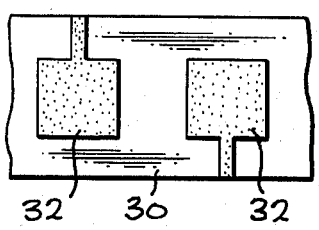 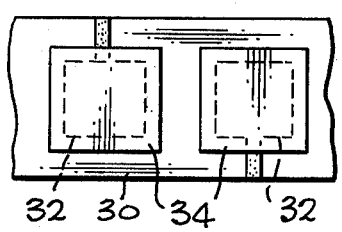 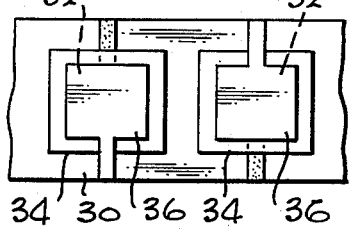
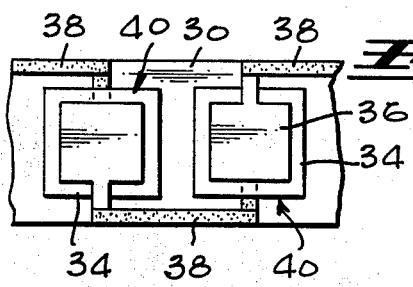 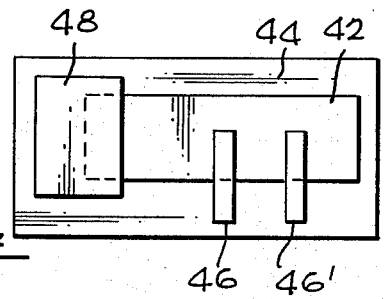

PRODUCTION OF THIN, STABLE, SOLID ELECTROLYTE FILMS OF HIGH IONIC CONDUCTIVITY

BACKGROUND OF THE INVENTION

The present invention relates to the production of thin films of complex silver iodo solid electrolytes on a substrate, and is particularly concerned with the deposition on a substrate such as a ceramic substrate or a metallic substrate, e.g. forming an electrode of a coulometer or a battery, of a thin stable film of oxy-anion-substituted silver iodide solid electrolyte, such as $Ag_{19}I_{15}P_2O_7$, such film having good ionic conductivity at ambient temperature and particularly containing iodine in stoichiometric proportion, substantially without any excess or deficiency thereof, and to procedure for producing such films, and for incorporating such films into devices such as batteries, coulometers, memory devices, and the like.

The solid electrolyte devices have several distinct advantages over those based on liquid electrolytes. These include (1) the capability of pressure-packaging or hard encapsulation to yield extremely rugged assemblies, (2) the extension of the operating temperature range since the freezing and/or boiling-off of the liquid phase, which drastically affect the device performance when employing liquid electrolytes are no longer a consideration, (3) solid electrolyte devices are truly leak-proof, (4) they have long shelf life due to the prevention of the corrosion of electrodes and of loss of solvent by drying out which occur when using liquid electrolytes, and (5) solid electrolytes permit microminiaturization.

All of the above considerations have led to a growing use of solid electrolytes. Solid state batteries and timers are already available which employ the solid electrolyte as a cylindrical pellet with suitable electrodes on either side. However, this kind of geometry leads to somewhat poor solid-solid contacts and these devices tend to have high internal resistances and polarization losses. These problems have been overcome by the use of thin films as the electrolytes, since thin films deposited on top of each other have excellent contacts and should also be able to withstand shocks, acceleration forces and spin rates without undue damage. Furthermore, the power requirements of electronic devices are being continually reduced by the development of more sophisticated micro-electronic circuit components. If such advances are to be utilized to their fullest extent, there must be a corresponding reduction in the size of the power sources which can only be accomplished by employing thin film batteries.

Several solid electrolytes are known to exhibit good ionic conductivity, some of which exist in the form of thin films. Oxide ion conductors such as zirconia are operated at high temperatures due to their low conductivity at ambient temperatures. Chloride ion conductors such as $PbCl_2$ and $BaCl_2$ have similar temperature restrictions. Most silver halides such as $AgBr$, $AgCl$, and $AgI$ also show low room temperature ionic conductivity but new compounds, based on the modifications of silver iodide (AgI), have recently been synthesized which show high ionic conductivity at room temperature. Such modifications of silver iodide involve partial replacement of either the cation (silver) or the anion (iodine) or both by some other suitable ions.

Cationic substitution leads to compounds of the type $MAg_4I_5$ where M may be either Rb or K or $NH_4$. The most stable of these compounds, which also shows the highest room temperature ionic conductivity, is $RbAg_4I_5$ but its use creates its own problems. It is known that the thin films of $RbAg_4I_5$ generally contain excess iodine which causes corrosion of the electrodes which in turn reduces the shelf life of the devices using these films.

On the other hand, a partial anionic substitution in silver iodide gives rise to compounds which are known as oxy-anion-substituted silver iodide electrolytes, a typical example of which is $Ag_{19}I_{15}P_2O_7$. These latter solid electrolytes are all known to be stable at ambient temperatures and humidity for long periods of time and show good ionic conductivity. However, employing conventional techniques of vacuum evaporation, flash evaporation and sputtering, for depositing thin films of these electrolytes on a substrate have heretofore been largely unsuccessful since they have yielded films of these compounds of relatively low ionic conductivity, with the typical value being between $10^{-5}$ to $10^{-6}$ (ohm - cm)$^{-1}$. The main factor in the production of such undesirable low ionic conductivity films has been the failure of the above noted prior art techniques for depositing the vapors of such compounds on the substrate in stoichiometric proportions.

Thus, in the successful fabrication of stoichiometric films of the above noted oxy-anion-substituted silver iodide electrolytes, the major consideration is that the net condensation of the vapors onto the substrates be stoichiometric. The net condensation involves the total amount of vapors arriving at the substrates, what fraction will deposit on them and what fraction will re-evaporate from the substrate.

It is generally believed that the conventional methods of film formation fail with $Ag_{19}I_{15}P_2O_7$ and other oxy-anion-substituted silver iodide compounds due to the great differences that exist in vapor pressures of the silver-containing, iodine-containing and oxy-anion containing constituents when these electrolytes are heated. It must be remembered that these compounds have incongruent melting points. Therefore, they decompose on evaporation and do not deposit on the substrates in the proper stoichiometric proportions.

It is accordingly an object of the invention to produce thin stable films of complex silver iodo solid electrolytes on a substrate, such films having good ionic conductivity at room temperature and maintaining such conductivity over extended periods of use and storing. A particular object of the invention is the provision of novel procedure for depositing such films, particularly oxy-anion-substituted silver iodide solid electrolyte films, such as $Ag_{19}I_{15}P_2O_7$, on a substrate, by flash evaporation or RF sputtering, under conditions such that the condensation of the vapors unto the substrate is substantially stoichiometric, particularly with respect to the iodine content of the electrolyte, and avoiding an excess or deficiency of iodine in the deposited solid electrolyte film, thereby producing electrolyte films which are stable and have good ionic conductivity at room temperature. A still further object is the production of improved thin solid electrolyte films of the aforementioned type, deposited on a substrate, and which are particularly useful in the formation of thin-film batteries, coulometers, memory devices, and the like.

DESCRIPTION OF THE INVENTION

It has been found according to the present invention that the successful deposition of thin stable films of complex silver iodo solid electrolytes, particularly oxy-anion-substituted silver iodide solid electrolytes, which have high ionic conductivity at ambient temperature, can now be accomplished by the processes of flash evaporation and RF sputtering, but such processes require particularly that the substrate temperature be maintained at a sufficiently elevated temperature so that the decomposition vapors of the electrolyte material recombine and deposit on the substrate, with the net deposition or condensation of such vapors on the substrate being stoichiometric, whereby the resulting solid electrolyte films are neither iodine-rich nor iodine-poor.

It has also been found that other secondary parameters such as the source temperature in the case of flash evaporation, and potential across the electrodes in the case of the use of RF sputtering, are important secondary factors which aid in the production of the above noted highly ionic conductive thin solid electrolyte films.

Additional factors which are common both to flash evaporation and to RF sputtering for production of effective stable and highly ionic conductive electrolyte films of the above type include the rate of film deposition on the substrate, and the total film thickness.

As previously noted, the preferred source of electrolyte material or evaporant when employing either of the above noted flash evaporation or RF sputtering procedures, are the oxy-anion-substituted silver iodide electrolytes, examples of which are $Ag_6I_4WO_4$, $Ag_7I_4AsO_4$, $Ag_7I_4VO_4$, $Ag_7I_4PO_4$ and $Ag_{19}I_{15}P_2O_7$. These electrolytes are all known to be stable at ambient temperature and humidity for long periods of time and have good ionic conductivity and when deposited as thin films according to the invention procedure. Other compounds of this general class which can be employed include $Ag_3SI$, but its use as the electrolyte in batteries and coulometers is not preferred, especially in thin film form, since slight non-stoichiometry for this material often occurs, which results in substantial electronic conductivity as contrasted with desirable ionic conductivity. Such electronic conductivity is undesirable during operation of the device. Other electrolyte compounds involving partial replacement of cations in silver iodide such as $RbAg_4I_5$, and both anions and cations in silver iodide, such as $[(CH_3)_4 NI.6AgI]$, $RbAg_4I_4CN$ and $KAg_4I_4CN$, can also be employed as suitable electrolyte sources or evaporants in the invention procedures. The term "silver iodo solid electrolytes", as employed herein, is intended to denote all of the above types of solid electrolytes. However, the invention is particularly concerned with the successful deposition or formation of thin films of the above noted oxy-anion-substituted silver iodide compounds.

In place of the above electrolyte compounds, there can be employed as source electrolytes a mixture of the components of the electrolyte, in stoichiometric proportions so that the vaporized decomposition products including, for example, silver-containing, iodine-containing and oxy-anion containing constituents, will deposit on the substrate in proper stoichiometric proportions to form the thin film of the oxy-anion-substituted silver iodide solid electrolyte. Thus, for example in place of the electrolyte source $Ag_{19}I_{15}P_2O_7$, there can be employed a mixture of powders of AgI and $Ag_4P_2O_7$, in the molar ratio of 15 to 1 to form $Ag_{19}I_{15}P_2O_7$ ($15 AgI + 1 Ag_4P_2O_7 = Ag_{19}I_{15}P_2O_7$).

The invention will be more clearly understood by reference to the detailed description below, taken in connection with the accompanying drawings, wherein:

FIG. 1 is a schematic illustration of a system for carrying out the flash evaporation procedure of the invention;

FIG. 2 is a schematic illustration of a system for carrying out the RF sputtering procedure according to the invention:

FIGS. 3a, 3b, 3c and 3d illustrate fabrication of a series-connected "ribbon" battery employing the invention procedure;

FIG. 4 illustrates a 3-terminal array employing an electrolyte deposited according to the invention procedure; and FIG. 5 illustrates a thin film hybrid micro-electronic circuit employing a power source containing a solid electrolyte film deposited according to the invention procedure.

Referring to FIG. 1 of the drawing, in the flash evaporation procedure, a box or baffle-type boat or evaporation source, indicated at 10, and formed of a suitable high temperature resistant material such as tantalum, is heated to a temperature in the range noted below, as by an electrical heater indicated as 12, and electrolyte particles are then fed from a feeder device (not shown) directly into the heated boat or source 10, as indicated at 14. These electrolyte particles, on arriving at the source, are instantaneously vaporized and are deposited to predetermined thicknesses, as described in detail below, on a substrate 18, formed of a suitable material such as ceramic or a metal, e.g. forming an electrode of an electrochemical device such as a battery or coulometer, e.g. a silver or gold substrate.

As previously noted, the substrate is maintained at a temperature within the range as set forth below, in order to deposit a stoichiometric solid electrolyte film 20 thereon, which is neither iodine-rich nor iodine-poor. The space 16 within the system illustrated in FIG. 1 is maintained under reduced pressure or vacuum e.g. ranging from about $10^{-6}$ to about $8 \times 10^{-5}$ torr, by suitable means such as a vacuum pump (not shown).

The RF sputtering procedure carried out according to the invention is illustrated in FIG. 2 of the drawing. The system employed is similar to that illustrated in FIG. 1 except that in the RF sputtering procedure, a pair of electrodes, including a cathode 22 and an anode 24 are provided, and a potential is maintained across such electrodes preferably within the range as set forth below. The space 16' in the system of FIG. 2 is filled with an inert gas such as argon, e.g. at a pressure ranging from about $10^{-3}$ to about $10^{-2}$ torr, which is ionized therein by the RF field, and the ionized gas impinges against the solid electrolyte in the form of a compressed tablet or pill 14 placed on the cathode 22, causing particles of the electrolyte 14 to vaporize within the space 16' and to deposit in the form of a thin stoichiometric film 20 on the substrate 18 which is positioned against and supported by the anode 24, such substrate also maintained within the same temperature range as the substrate in the case of the flash evaporation procedure illustrated in FIG. 1, to obtain a stoichiometric solid electrolyte film on such substrate. It will be noted that instead of employing the solid electrolyte in the form of a compressed tablet, solid electrolyte powder can be employed, against which the ionized gas within space 16' impinges to cause vaporization of such solid electrolyte. A radio frequency (RF) voltage is applied at 26 to the electrode 22, and as result of the capacitive coupling through the solid electrolyte or target 14, an RF plasma sheath 28 is induced on the front face of the target during the RF sputtering procedure.

The term "vacuum" deposition as employed herein is intended to denote either flash evaporation or the sputtering procedure, described above.

The temperature of the target, that is the receptacle or boat 10 in the flash evaporation procedure, or the voltage conditions across the electrodes 22 and 24 in the RF sputtering procedure are such that the products, e.g. silver-containing, iodine-containing and oxy-anion-containing constituents, that result from the vacuum deposition of, for example, an oxy-anion-substituted silver iodide electrolyte material 14, are in approximately stoichiometric ratio in the vapor or gas form, with respect to the initial solid electrolyte, or mixture of powders forming such electrolyte, and that as the vaporized electrolyte materials deposit on the substrate 18, the temperature of the substrate is sufficient to maintain the stoichiometric ratio of these materials while they recombine to form the original oxy-anion-substituted silver iodide electrolyte film, so that it is neither iodine-rich nor iodine-poor, and if there are trace amounts of excess iodine compounds deposited on the substrate such excess iodine compounds can be evaporated off as the original stoichiometric solid electrolyte compound reforms on the substrate.

Deposition of desirable films of oxy-anion-substituted silver iodide electrolytes using flash evaporation requires the use of extremely high source temperatures. This is due to the fact that the vapor pressures of the silver-containing and the oxy-anion-containing constituents are rather low at temperatures below about 1200° C, and rise rapidly at temperatures exceeding about 1250° to 1300° C. Therefore, in order to obtain sufficiently high vapor pressures of all of the species involved of this class of electrolytes, high evaporation source temperatures, of at least 1200° C, e.g. ranging from about 1250° to about 1600° C, and preferably in the range of about 1400° to about 1600° C are required. On the other hand due to the different melting characteristics of other complex silver iodo silver electrolytes such as $RbAg_4I_5$, lower source temperatures, preferably in the range of about 900° to about 1100° C are required for such electrolytes.

On the other hand, using RF sputtering for depositing these films, the potential across the electrodes becomes an important parameter. Generally, for the complex silver iodo solid electrolytes, particularly the oxy-anion-substituted silver iodide electrolytes employed herein, the voltage or potential across the electrodes should range from about 700 to about 900 volts. Too high potentials, for example, above about 900 volts for certain oxy-anion-substituted silver iodide electrolytes such as $Ag_{19}I_{15}P_2O_7$, result in unstable plasma due to the low argon pressures employed, and in poor adherence of the films to the substrates, whereas too low potentials, below about 700 volts, result in non-uniformity in film thickness. RF frequency can range from about 10 to about 15 $MH_z$. The temperature of the target or receptacle containing the solid electrolyte material in RF sputtering, is of relatively minor importance in this procedure, but should be below about 200° C, e.g. ranging from about 20° to about 200° C.

As previously noted, the substrate temperature in each of the evaporation and RF sputtering procedures according to the invention is substantially the same and insures proper film structure and stoichiometry. When a stoichiometric compound such as $Ag_{19}I_{15}P_2O_7$ is heated in the evaporation source, it preferentially loses iodine-containing constituents, leaving a residue rich in silver-containing and oxy-anion containing constiuents. This results in the deposition of films on the substrates which contain more iodine than required by the stoichiometry. When the substrate itself is heated, then it should also lose iodine-containing constituents preferentially.

For oxy-anion-substituted silver iodide electrolytes such as $Ag_{19}I_{15}P_2O_7$, temperature of the substrate should be within the range of about 130° to 155° C. It has been found however, that when the substrate is maintained at a temperature exceeding about 150° C, the deposited films commence to lose excess iodine and if the temperature is below about 140° C, then the loss of iodine from the film is not sufficient. However, it has been found that within the preferred narrow temperature range between about 140° and 150° C employing the above electrolytes, a dynamic balance occurs so that the amount of iodine deposited on the substrate is substantially stoichiometric. In the case of other complex silver iodo solid electrolytes such as $RbAg_4I_5$, substrate temperatures are maintained substantially lower, ranging from about 60° to about 80° C.

Other factors which are common both to the flash evaporation and to RF sputtering are the rate of film deposition and the total film thickness. At elevated substrate temperatures, the initial film nuclei tend to grow into an island-type film structure resulting in non-continuous films. These films tend to have pinholes and to avoid this problem, higher rates of film deposition, higher than about 15 Å/sec, are required. However, such film deposition rates should not exceed 60 Å/sec, otherwise the adhesion of the electrolyte films to the substrate is reduced. The preferred range of film deposition rate is 20 to 50 Å/sec. Film thickness of the vacuum deposited solid electrolyte according to the invention can range generally from about 5,000 to about 50,000 Å for good results. However, when film thickness of the deposited solid electrolyte is less than 20,000 Å, occasionally the films deposited tend to have pinholes, resulting in shorting problems. A preferred film thickness range accordingly ranges from about 25,000 to about 50,000 Å.

The ionic conductivity of the solid electrolyte films produced by either flash evaporation or RF sputtering according to the invention, is equal to or greater than $10^{-3}$(ohm cm)$^{-1}$ and preferably equal to or greater than $10^{-2}$ (ohm - cm)$^{-1}$, at ambient or room temperature. These ionic conductivities are substantially greater than the ionic conductivities of solid electrolyte films deposited by prior art procedures employing vacuum or flash evaporation, or RF sputtering, of oxy-anion-substituted silver iodide electrolytes.

The invention accordingly is believed to present the first evidence of the successful formation of thin stable films of complex silver iodo solid electrolytes which exhibit high ionic conductivity at ambient temperature, as noted above and wherein such solid electrolyte films contain a stoichiometric proportion of iodine, free of any deficiency or of any excess of iodine which would lead to degradation of the electrolyte film.

I have found that stoichiometric and stable films of $Ag_{19}I_{15}P_2O_7$ which show good ionic conductivity at ambient temperatures can be deposited using the following methods and parameters of operation:

(1) flash evaporation with:

evaporant = stoichiometric electrolyte ($Ag_{19}I_{15}P_2O_7$)
source temperature = 1400°–1600° C
substrate temperature = 140°–150° C
initial pressure = $10^{-6}$ torr
Total film thickness = 25,000 to 50,000 Å
Rate of film deposition = 15–60 Å/sec (2) RF sputtering with:

evaporant = stoichiometric electrolyte ($Ag_{19}I_{15}P_2O_7$)
potential across electrodes = 700–900 volts
argon gas pressure = $4 \times 10^{-3}$ torr
source temperature = 100°–175° C
substrate temperature = 140°–150° C
spacing between electrodes = 4 cm
RF frequency = 11 to 13 $MH_z$
Total film thickness = 25,000 to 50,000 Å
Rate of film deposition = 15–60 Å/sec On the other hand, stoichiometric and stable films of $RbAg_4I_5$ which have good ionic conductivity at ambient temperature can be deposited by using the following parameters of operation.

(3) Flash Evaporation of $RbAg_4I_5$ using the invention process:

evaporant = stoichiometric electrolyte ($RbAg_4I_5$)
source temperature = 900°–1100° C
substrate temperature = 60°–80° C
initial pressure = $10^{-6}$ torr
Total film thickness = 25,000–50,000 Å
Rate of film deposition = 15–60 Å/sec.

The following examples illustrate the practice of this invention, but are not intended as limitative.

EXAMPLE 1

$Ag_{19}I_{15}P_2O_7$ was prepared by vacuum fusion. Its bulk ionic conductivity was found to be 0.09 (ohm - cm)$^{-1}$. About 5 g. of this material was placed in a baffle-type evaporation source formed of tantalum. At an initial vacuum of $10^{-6}$ torr, the evaporation source was heated using a current of 20 amp. to a temperature of 510° C for 10 minutes to melt and degas the solid electrolyte, and then the current was increased to 30 amp. and a temperature of 750° C to deposit the solid electrolyte film on ceramic substrates over a period of 9 minutes such that the film thickness so obtained was 21,000 Å. The substrate temperature during the film deposition was kept below 60° C. The ionic conductivity of these films at room temperature was found to be $4.5 \times 10^{-5}$ (ohm - cm)$^{-1}$ which is too low to be of practical usefulness. Increasing the evaporation source temperature to 1150° C by using currents of 70 amp. results in similar films of low conductivity.

EXAMPLE 2

About 10g of the solid $Ag_{19}I_{15}P_2O_7$ electrolyte, as prepared in example 1, was placed in a vibratory feeder. At an initial vacuum of $10^{-6}$ torr, the evaporation source was heated to about 800°–1000° C using a current of about 60–80 amp. and the electrolyte particles were then fed from the vibratory feeder via a funnel to the evaporation source. Solid electrolyte films of thickness between 2,000 and 25,000 Å were deposited at substrate temperatures of 60°–80° C and their ionic conductivities measured, which were found to be about $2 \times 10^{-5}$ (ohm - cm)$^{-1}$, which are again too low.

EXAMPLE 3

About 40g of the electrolyte, as prepared in Example 1 but of particles size smaller than No. 200 mesh Tyler screen, was used as the target in a RF sputtering deposition employing argon gas. The potential across the electrodes was varied between 600 and 1500 volts, the substrate temperature maintained at below 75° C, the electrode spacing kept at 4 cm. and the $Ar^+$ gas pressure at $4 \times 10^{-3}$ torr. The films were deposited to thickness of 10,000 to 40,000 Å and their ionic conductivities were found to vary between 1 and $3 \times 10^{-5}$ (ohm - cm)$^{31\ 1}$ which are again too low.

EXAMPLE 4

About 10g of the electrolyte, as prepared in example 1, was placed in a vibratory feeder. At an initial vacuum of $10^{-6}$ torr, a box-type evaporation source of tantalum material was heated to a temperature of 1400°–1600° C., and the electrolyte particles of size between No. 40 and 70 mesh screens were then fed from the vibratory feeder directly into the heated source. These particles, on arriving at the source, instantaneously vaporized and the solid electrolyte films were deposited to thicknesses between 8,000 and 50,000 Å with the substrates maintained at a temperature between 140° and 150° C. The ionic conductivity of these films at room temperature was found to vary between $2 \times 10^{-2}$ and $3.5 \times 10^{-2}$ (ohm - cm)$^{-1}$ whereas the ionic conductivity obtained by using the methods of Examples 1 and 2 was about 2 to $5 \times 10^{-5}$ (ohm - cm)$^{-1}$. Therefore, the method outlined in this example yields solid electrolyte films of high ionic conductivity and shows the marked improvement of the method of this invention over the conventional methods.

When a mixture of powders of AgI and $Ag_4P_2O_7$, in the molar stoichiometric ratio of 15 to 1 (15 AgI + 1 $Ag_4P_2O_7 = Ag_{19}I_{15}P_2O_7$) was employed in place of $Ag_{19}I_{15}P_2O_7$, essentially similar results were obtained.

This is the first time known to applicant, where thin stable films of such solid electrolytes have been successfully deposited which show high ionic conductivity at ambient temperature.

EXAMPLE 5

Solid electrolyte films were again deposited exactly duplicating the method of Example 4 but this time $Ag_7I_4PO_4$ was used as the electrolyte. The ionic conductivity of the films so obtained varied between $6 \times 10^{-3}$ and $9 \times 10^{-3}$ (ohm - cm)$^{-1}$. This method, therefore, again yields solid electrolyte films of good ionic conductivity, but lower than the ionic conductivity of the $Ag_{19}I_{15}P_2O_7$ films of Example 4.

EXAMPLE 6

Solid electrolyte films were deposited by the method of Example 4. This time, however, $Ag_6I_4WO_4$ was used as the electrolyte. The ionic conductivity of these films was found to vary between $1 \times 10^{-2}$ and $1.6 \times 10^{-2}$ (ohm - cm)$^{-1}$. Once again, it is seen that the invention procedure yields solid electrolyte films of good ionic conductivity.

EXAMPLE 7

Films of $Ag_{19}I_{15}P_2O_7$ were deposited by RF sputtering using the method of Example 3. This time, however, the substrates were maintained at a temperature between 140° to 150° C and the electrode potential was kept between 700 and 900 volts. The ionic conductivity of these films was found to vary between $2 \times 10^{-3}$ and $4.5 \times 10^{-3}$ (ohm - cm)$^{-1}$ whereas the conductivity obtained by using the method of Example 3 was about $3 \times 10^{-5}$ (ohm - cm)$^{-1}$. Thus it is seen that the invention feature of maintaining the substrate at a temperature between 140° and 150° C has again markedly improved the film ionic conductivity.

EXAMPLE 8

Films of $Ag_{19}I_{15}P_2O_7$ were deposited using the method of Example 4 and the ionic conductivity of the films so obtained was found to vary between $2 \times 10^{-2}$ and $3.5 \times 10^{-2}$ (ohm - cm)$^{-1}$. These films were then stored in a dry box and their conductivity was monitored at various time intervals. It was found that the ionic conductivity dropped to about $1.2 \times 10^{-2}$ (ohm - cm)$^{-1}$ after about 2 days and thereafter it stabilized and remained constant at a value between $0.9 \times 10^{-2}$ and $1 \times 10^{-2}$ (ohm - cm)$^{-1}$ up to intervals of more than 5 weeks.

EXAMPLE 9

Sandwich-type coulometers were each fabricated on four glass slides as follows. First a set of 11 gold electrodes, 2000 Å thick, were deposited on each glass slide, followed by a set of 11 square pads of $Ag_{19}I_{15}P_2O_7$, 25,000 Å thick, using the method outlined in Example 4. These solid electrolyte square pads completely covered the gold electrodes. Finally, a common silver strip, 3000 Å thick, was deposited over these electrolyte pads to complete the fabrication of each of the coulometer devices.

These coulometers were then charged (plated) and discharged (stripped) at currents between 1 to 10 μAmp (microamps) to a cut-off potential of 400 mV (millivolts). It was found that the efficiency of these coulometers was consistently high, being above 98% when discharged immediately after charging. When the coulometers were stored after charging, it was found that their efficiency dropped slightly but it was still above 90% after a storage time of 24 hours. It is seen, therefore, that the solid electrolyte films as deposited using the method of Example 4 result in coulometers which show good performance.

EXAMPLE 10

Sandwich-type batteries were each fabricated on four glass slides as follows. First, a common strip of silver 3000 Å thick, was deposited on each glass slide followed by a set of 11 square pads of $Ag_{19}I_{15}P_2O_7$, 25,000 Å thick, using the method outlined in Example 4. Finally, a set of 11 tellurium electrodes, followed by 11 gold electrodes, 2,000 Å thick each, were vacuum deposited. These tellurium and gold electrodes were smaller in size than the electrolyte pads and thus isolated from the silver electrode. The room temperature open-circuit voltage of this cell was found to be 217 millivolts. These batteries were rechargeable and showed internal resistance of 10,000 to 50,000 ohms. Energy densities obtained with these batteries were about 0.40 to 0.50 watt-hr./in$^3$ and currents of up to 20 μA/cm$^2$ could be drawn.

EXAMPLE 11

The invention concept can be extended to fabricate a series-connected "ribbon" battery as follows. Referring to FIGS. 3a, 3b, 3c, and 3d of the drawing, there was first deposited on a glass substrate 30 a pair of gold electrodes 32 as seen in FIG. 3a, followed by a second deposition over the gold electrodes 32, of solid electrolyte $Ag_{19}I_{15}P_2O_7$ film 34, as seen in FIG. 3b, using the method of deposition described in Example 4.

Thereafter, referring to FIG. 3c, a silver film 36 was deposited over each of the solid electrolyte films 34. The gold and silver electrodes 32 and 36 were smaller in size than the electrolyte pads 34, and thus were isolated from each other. Referring to FIG. 3d, intercell connections 38 of copper were then deposited to connect the respective cells 40 thus formed.

EXAMPLE 12

Sandwich type coulometers were again fabricated exactly duplicating the method of example 9 but this time $Ag_7I_4PO_4$ was used as the electrolyte. These were then charged (plated) and discharged (stripped) using currents between 1 to 10 μAmp to a cut-off potential of 400 mV. It was found that the efficiency of these coulometers was again consistently high, being above 97% when discharged immediately after charging. When the coulometers were stored after charging, it was found that their efficiency dropped slightly but it was still satisfactory, being above 89% after a storage time of 24 hours.

EXAMPLE 13

A three-terminal array of the type $Ag/Ag_{19}I_{15}P_2O_7/Pt_1/Ag_{19}I_{15}P_2O_7/Pt_2$ as shown in FIG. 4 was fabricated. The solid electrolyte film 42 was first deposited on a ceramic substrate 44, by the method described in Example 4. Then two platinum electrodes 46 (Pt$_1$) and 46' (Pt$_2$) were deposited over portions of the electrolyte film 42, followed by deposition of a silver electrode 48 over a portion of electrolyte film 42, and spaced from platinum electrodes 46 and 46'.

The voltage between the Ag and platinum electrodes 48 and 46 (Pt$_1$) is adjusted by suitable charging following the method of Example 9. The voltage between the platinum electrodes 46 and 46' is first made equal to zero by shorting them initially. During the discharge cycle, silver is transferred from silver electrode 48 to platinum electrode 46, which becomes negative with respect to platinum electrode 46', due to its greater amount of silver. This device now works as a memory element in which "read-in" is the current passing through the silver and platinum electrodes 48 and 46, and "read-out" is a voltage change between the platinum electodes 46 and 46'.

Use of a four-terminal cell of the type $Ag_1/Ag_{19}I_{15}P_2O_7/Pt_1/Ag_{19}I_{15}P_2O_7/Pt_2/Ag_{19}I_{15}P_2O_7/Ag_2$ and alternate discharge between $Ag_1$ and $Pt_1$ and between $Ag_2$ and $Pt_2$ yields a positive or a negative voltage read-out between $Pt_1$ and $Pt_2$.

EXAMPLE 14

Referring to FIG. 5, a thin film hybrid circuit (TFHC) is formed initially by sputtering a layer of tantalum 50 serving as resistor on an alumina substrate 52. Then a silver conductor layer 54 is vacuum deposited over the tantalum. The resistor-conductor pattern is photoetched and a tantalum oxide dielectric layer 56 is reactively sputtered in pre-determined areas to serve as capacitors and cross-over insulation. Aluminum conductor layer 58 is then deposited in pre-determined areas to serve as capacitor electrodes and cross over connections. The solid electrolyte power source 60, consisting of $Ag/Ag_{19}I_{15}P_2O_7/Te/Au$ and fabricated following the method of Example 10, is then die bonded in the circuit. This power source is mounted on a silicon dioxide insulator block 72, in turn mounted on a support element 74 containing emitter and collector 76 and 78, respectively. A gold wire 82 connects to the silver anode of the power source 60 and a gold wire 84 connects to the gold cathode of the power source.

Current surges of up to 0.5 $mA/cm^2$ at short circuit are observed from the power source 60. After the solid electrolyte power source 60 has been bonded to the gold wires 82 and 84, and such wires connected in the integrated circuit 86, the entire assembly is encapsulated in epoxy, as indicated at 88.

EXAMPLE 15

The procedure and circuit of Example 14 are duplicated except that no cathode depolarizer film of Te, is employed. A current of 50 $\mu A/cm^2$ is passed through the integrated circuit during its operation. When the anodic silver is completely removed the resistance of the device, which has now served as a coulometer, increases 10 times, triggering a signal response in the circuit.

EXAMPLE 16

$RbAg_4I_5$ was prepared by vacuum fusion. About 10g. of this material was placed in a vibratory feeder. At an initial vacuum of $10^{-6}$ torr, a box-type evaporation source of tantalum material was heated to a temperature of 900° – 1100° C and the electrolyte particles of size between 40 and 70 mesh were then fed from a vibratory feeder directly into the heated source. These particles, on arriving at the source, instantaneously vaporized and the solid electrolyte films were deposited to thicknesses between 10,000 and 50,000 Å with the substrates maintained at a temperature between 60° and 80° C. The ionic conductivity of these films was found to be about 0.20 – 0.24 $(ohm - cm)^{-1}$ which remained fairly constant over a period of up to 1 month.

EXAMPLE 17

Sandwich type coulometers were fabricated following the method of Example 9 but using $RbAg_4I_5$ as the electrolyte. These were then charged and discharged using currents between 1 to 10 $\mu Amp$ to a cut-off potential of 400 mV. It was found that the efficiency of these coulometers was consistently high, being above 98% when discharged immediately after charging. When the coulometers were stored after charging, it was found that their efficiency remained quite high, being above 80% even after 1 month. When similar tests were carried out using the conventional method of film deposition for $RbAg_4I_5$, the efficiency fell to below 70% after only 3 – 4 days. This clearly shows the marked improvement resulting from the invention procedure.

From the foregoing, it is seen that the invention provides a novel method for efficiently depositing improved novel films, particularly of oxy-anion-substituted silver iodide solid electrolytes, which have high ionic conductivity at room temperature and which remain relatively stable over extended periods of time, and which are particularly useful in the fabrication of batteries, coulometers, memory devices and power sources for micro-electronic circuits. The invention procedure, involving the use of either flash evaporation or RF sputtering, involves as an essential feature the maintenance of the substrate on which the solid electrolyte films are deposited, at a sufficiently high temperature to provide net condensation of the vapors of the electrolyte constituents unto the substrate in stoichiometric proportions to form the solid electrolyte film, without either excess or deficiency in the stoichiometric proportion of iodine in the deposited electrolyte films. Other auxiliary features aiding such deposition of high ionic conductivity solid electrolyte films include, for example, suitable high temperature maintenance of the source of electrolyte in flash evaporation, and proper potentials across the electrodes in the RF sputtering procedure.

While particular embodiments of the invention have been described for purposes of illustration within the spirit of the invention, it will be understood that the invention is not to be taken as limited except by the scope of the appended claims.

What is claimed is:

1. A process for depositing thin films of complex silver iodo solid electrolytes on a substrate, said electrolytes having good ionic conductivity at room temperature, which comprises evaporating an electrolyte material selected from the group consisting of (a) a stoichiometric complex silver iodo solid electrolyte material and (b) a mixture of the components in stoichiometric proportions of said solid electrolyte material, by flash evaporation, and wherein the vaporized products include silver-containing and iodine-containing constituents, and depositing said constituents on a heated substrate while maintaining the temperature of said heated substrate at a sufficiently elevated temperature to maintain the original stoichiometric ratio of said constituents as they recombine and deposit on said substrate to form the original solid electrolyte material.

2. The process as defined in claim 1, said evaporation of said solid electrolyte material or said mixture of said components thereof being carried out by flash evaporation at high temperatures.

3. The process as defined in claim 1, wherein said electrolyte material is a mixture of the components of said electrolyte material in stoichiometric proportions.

4. The process as defined in claim 1, wherein said electrolyte material is an oxy-anion-substituted silver iodide solid electrolyte.

5. The process as defined in claim 1, wherein said electrolyte material is a mixture of powders comprising the components of an oxy-anion-substituted silver iodide electrolyte, in stoichiometric proportions.

6. The process as defined in claim 1, wherein said electrolyte material is a cation substituted silver iodide solid electrolyte.

7. The process as defined in claim 1, wherein said electrolyte material is an anion and cation substituted silver iodide solid electrolyte.

8. The process as defined in claim 6, wherein said solid electrolyte is $RbAg_4I_5$, said electrolyte is vaporized at temperature ranging from about 900° to about 1100° C and said substrate is maintained at temperature ranging from 60° to about 80° C.

9. A process for fabricating stable thin films of oxy-anion-substituted silver iodide solid electrolytes having high ionic conductivity at room temperature, on a substrate, which comprises vaporizing an electrolyte material selected from the group consisting of (a) an oxy-anion-substituted silver iodide solid electrolyte and (b) a mixture of the components in stoichiometric proportions of said last mentioned solid electrolyte, by flash evaporation, and wherein the vaporized decomposition products of said electrolyte material include silver-containing iodine-containing and oxy-anion-containing constituents, and depositing said vaporized constituents on a substrate which is maintained at a high temperature such that the net condensation of the vapors of said constituents on said substrate is in proper stoichiometric proportions to form a thin film of said oxy-anion-substituted silver iodide solid electrolyte, said solid electrolyte film being neither iodine-poor nor iodine-rich with respect to the stoichiometric proportion of iodine in said solid electrolyte.

10. The process as defined in claim 9, wherein said solid electrolyte is $Ag_{19}I_{15}P_2O_7$, or a mixture of AgI and $Ag_4P_2O_7$ in stoichiometric proportions to form $Ag_{19}I_{15}P_2O_7$, said substrate being maintained at a temperature ranging from about 130° to about 155° C.

11. The process as defined in claim 9, said oxy-anion-substituted silver iodide selected from the group consisting of $Ag_6I_4WO_4$, $Ag_7I_4AsO_4$, $Ag_7I_4VO_4$, $Ag_7I_4PO_4$ and $Ag_{19}I_{15}P_2O_7$.

12. The process as defined in claim 11, said substrate being maintained at a temperature ranging from about 130° to about 155° C.

13. The process as defined in claim 11, wherein said solid electrolyte is $Ag_{19}I_{15}P_2O_7$, or a mixture of AgI and $Ag_4P_2O_7$ in stoichiometric proportions to form $Ag_{19}I_{15}P_2O_7$.

14. The process as defined in claim 12, said vaporizing said electrolyte material being carried out by flash evaporation of said electrolyte material at temperature ranging from about 1250° to about 1600° C.

15. The process as defined in claim 13, said vaporizing said electrolyte material being carried out by flash evaporation of said electrolyte material at temperature ranging from about 1400° to about 1600° C, and said substrate being maintained at a temperature ranging from about 140° to about 150° C.

16. The process as defined in claim 12, wherein said film of solid electrolyte is deposited on said substrate at a rate ranging from about 15 to about 60 Å/sec., and wherein said film is deposited to a thickness of about 5,000 to about 50,000 Å.

17. The process as defined in claim 15, wherein said film of solid electrolyte is deposited on said substrate at a rate ranging from about 20 to about 50 Å/sec., and wherein said film is deposited to a thickness of about 25,000 to about 50,000 Å.

18. The process as defined in claim 12, said substrate being a ceramic or metallic substrate.

19. A process for depositing thin films of complex silver iodo solid electrolytes on a substrate, said electrolytes having good ionic conductivity at room temperature, which comprises evaporating an electrolyte material selected from the group consisting of (a) a complex silver iodo solid electrolyte material and (b) a mixture of the components in stoichiometric proportions of said solid electrolyte material and wherein the vaporized products include silver-containing and iodine-containing constitutents, and depositing said constituents on a substrate while maintaining the temperature of said substrate at a sufficiently elevated temperature to maintain the original stoichiometric ratio of said constituents as they recombine and deposit on said substrate to form the original solid electrolyte material, said evaporation of said components thereof being carried out by RF sputtering at electrode potentials producing good adherence of the deposited solid electrolyte on said substrate, in the form of a film of substantially uniform thickness.

20. A process for fabricating stable thin films of oxy-anion-substituted silver iodide solid electrolytes having high ionic conductivity at room temperature, on a substrate, which comprises vaporizing an electolyte material selected from the group consisting of (a) an oxy-anion-substituted silver iodide solid electrolyte and (b) a mixture of the components in stoichiometric proportions of said last-mentioned solid electrolyte, by RF sputtering at potentials across the electrodes ranging from about 700 to about 900 volts, said electrolyte material maintained at a temperature below about 200° C, and wherein the vaporized decomposition products of said electrolyte material include silver-containing, iodine-containing and oxy-anion containing constituents, and depositing said vaporized constituents on a substrate which is maintained at a high temperature such that the net condensation of the vapors of said constituents on said substrate is in proper stoichiometric proportions to form a thin film of said oxy-anion-substituted silver iodide solid electrolyte, said solid electrolyte film being neither iodine-poor nor iodine-rich with respect to the stoichiometric proportion of iodine in said solid electrolyte, and wherein said solid electrolyte is $Ag_{19}I_{15}P_2O_7$, or a mixture of AgI and $Ag_4P_2O_7$ in stoichiometric proportions to form $Ag_{19}I_{15}P_2O_7$.

21. A process for fabricating stable thin films of oxy-anion-substituted silver iodide solid electrolytes having high ionic conductivity at room temperature, on a substrate, which comprises vaporizing an electrolyte material selected from the group consisting of (a) an oxy-anion-substituted silver iodide solid electrolyte and (b) a mixture of the components in stoichiometric proportions of said last-mentioned solid electrolyte, by RF sputtering at potentials across the electrodes ranging from about 700 to about 900 volts, and wherein the vaporized decomposition products of said electrolyte material include silver-containing, iodine-containing and oxy-anion-containing constituents, and depositing said vaporized constituents on a substrate which is maintained at a high temperature such that the net condensation of the vapors of said constituents on said substrate is in proper stoichiometric proportions to form a thin film of said oxy-anion-substituted silver iodide solid electrolyte, said solid electrolyte film being neither iodine-poor nor iodine-rich with respect to the stoichiometric proportion of iodine in said solid electrolyte, said oxy-anion-substituted silver iodide selected from the group consisting of $Ag_6I_4WO_4$, $Ag_7I_4AsO_4$, $Ag_7I_4VO_4$, $Ag_7I_4PO_4$ and $Ag_{19}I_{15}P_2O_7$, said substrate being maintained at a temperature ranging from about 130° L to about 155° C.

22. The process as defined in claim 21, wherein said film of solid electrolyte is deposited on said substrate at a rate ranging from about 20 to about 50 Å/sec., and wherein the film is deposited to a thickness of about 5,000 to about 50,000 Å.

* * * * *